US007969429B2

(12) United States Patent
Sasada et al.

(10) Patent No.: US 7,969,429 B2
(45) Date of Patent: *Jun. 28, 2011

(54) SUSTAIN DRIVER, SUSTAIN CONTROL SYSTEM, AND DISPLAY DEVICE

(75) Inventors: Masahiko Sasada, Kyoto (JP); Hiroki Matsunaga, Takatsuki (JP); Masashi Inao, Ibaraki (JP); Hiroshi Ando, Ibaraki (JP); Jinsaku Kaneda, Suita (JP); Eisaku Maeda, Takatsuki (JP); Akihiro Maejima, Takatsuki (JP)

(73) Assignee: Panasonic Corporation, Osaka (JP)

( * ) Notice: Subject to any disclaimer, the term of this patent is extended or adjusted under 35 U.S.C. 154(b) by 844 days.

This patent is subject to a terminal disclaimer.

(21) Appl. No.: 11/941,240

(22) Filed: Nov. 16, 2007

(65) Prior Publication Data

US 2008/0068368 A1 Mar. 20, 2008

Related U.S. Application Data

(63) Continuation of application No. 10/991,243, filed on Nov. 17, 2004, now Pat. No. 7,358,968.

(30) Foreign Application Priority Data

Nov. 19, 2003 (JP) ................................ 2003-389818
Nov. 12, 2004 (JP) ................................ 2004-329635

(51) Int. Cl.

| | |
|---|---|
| ***H01L 29/739*** | (2006.01) |
| ***H01L 31/00*** | (2006.01) |
| ***H03F 3/16*** | (2006.01) |
| ***G09G 3/28*** | (2006.01) |
| ***G09G 5/00*** | (2006.01) |
| ***G06F 3/038*** | (2006.01) |
| *H01L 27/10* | (2006.01) |
| *H01L 29/73* | (2006.01) |
| *H03F 3/04* | (2006.01) |
| *G09G 3/20* | (2006.01) |

(52) U.S. Cl. ........ 345/204; 257/197; 257/206; 257/207; 257/208; 330/250; 330/300; 345/205; 345/206; 345/214; 345/55; 345/60; 345/61; 345/68; 345/69

(58) Field of Classification Search .................. 257/197, 257/206–208; 330/250, 300; 345/204–206, 345/214, 55, 60, 61, 68–70
See application file for complete search history.

(56) References Cited

U.S. PATENT DOCUMENTS 4,492,957 A 1/1985 Marentic
(Continued)

FOREIGN PATENT DOCUMENTS

GB 2244400 A 11/1991
(Continued)

*Primary Examiner* — Alexander S Beck
(74) *Attorney, Agent, or Firm* — Panitch Schwarze Belisario & Nadel LLP

(57) ABSTRACT

The collector, emitter, and base of a bipolar transistor circuit are connected to a high side power supply terminal, the drain of a level shift transistor, and a floating power supply terminal, respectively. When a high side output transistor is on, the floating power supply terminal is at the potential of a high potential power supply terminal. The high side power supply terminal is at a potential higher than the potential of the floating power supply terminal by a constant voltage. Turning the level shift transistor on, its drain potential drops below the potential of the floating power supply terminal; The base current flows through the bipolar transistor circuit and the drain potential of the level shift transistor is clamped near the potential of the floating power supply terminal; The bipolar transistor circuit is turned on and its collector current supplies the drain current of the level shift transistor.

9 Claims, 8 Drawing Sheets

U.S. PATENT DOCUMENTS

| | | | | |
|---|---|---|---|---|
| 4,866,349 | A | 9/1989 | Weber et al. | |
| 4,866,495 | A | 9/1989 | Kinzer | |
| 5,023,678 | A | 6/1991 | Kinzer | |
| 5,081,400 | A | 1/1992 | Weber et al. | |
| 7,358,968 | B2 * | 4/2008 | Sasada et al. | 345/204 |
| 2002/0122016 | A1 | 9/2002 | Iwasa et al. | |

FOREIGN PATENT DOCUMENTS

| | | | |
|---|---|---|---|
| JP | 4-230117 | A | 8/1992 |
| JP | 2000-330514 | A | 11/2000 |
| JP | 2002-328649 | A | 11/2002 |

* cited by examiner

SUSTAIN DRIVER, SUSTAIN CONTROL SYSTEM, AND DISPLAY DEVICE

CROSS-REFERENCE TO RELATED APPLICATIONS

The present application is a continuation of pending U.S. patent application Ser. No. 10/991,243, filed Nov. 17, 2004, the entire subject matter of which is hereby incorporated by reference.

BACKGROUND OF THE INVENTION

This invention relates to a sustain driver that applies a sustaining voltage pulse to the electrodes of a plasma display panel (PDP), and in particular, relates to the control circuit for the sustain driver.

Plasma displays are display devices of the self-emission type, which use a light emission phenomenon caused by a discharge in gas. Plasma display panels (PDPs) are easy to upsize and slim down in contrast to other display devices, and furthermore, have advantages in flicker-free images, high contrasts, high-speed responses, and so on. Because of these advantages, plasma displays have become widespread in recent years, which are served as next-generation image display devices in place of CRTs (cathode-ray tubes).

A PDP comprises a basic structure with two substrates laminated. For example, in the structure of an AC type PDP, or in particular, the three-electrode surface-discharge type structure, a plurality of address electrodes are arranged on the rear substrate in the vertical direction of the panel, and a plurality of sustain and scan electrodes are alternately arranged on the front substrate in the horizontal direction of the panel. As another example, in the structure of a DC type PDP, or in particular, the pulse memory type structure, a plurality of anodes are arranged on the rear substrate in the vertical direction of the panel, and a plurality of cathodes are arranged on the front substrate in the horizontal direction of the panel. Discharge cells are placed at the intersections of the vertical and horizontal electrodes. A layer including phosphors is provided on the surfaces of the discharge cell. Gas fills the inside of the discharge cell.

In an AC type PDP, light emissions occur, for example, as follows. First, a high voltage pulse is applied between the scan and address electrodes. At that time, discharge in gas occurs in the discharge cell located at the intersection of those electrodes. Gas molecules in the discharge cell ionize to cations and electrons, which stick onto the surfaces of the discharge cell. Thus, wall charges accumulate on the surfaces of the discharge cell. Next, high voltage pulses (sustaining voltage pulses) are periodically applied to the sustain electrodes. On the other hand, the scan electrodes are maintained at, for example, approximately half the height of the peak of the sustaining voltage pulse. Thereby, an alternating voltage appears between the sustain and scan electrodes in each discharge cell. In a discharge cell accumulated the wall charges in advance, discharge in gas occurs due to the sum of the voltage induced by the wall charges and the sustaining voltage pulse. Gas molecules in the discharge cell ionize, and thereby, emit ultraviolet rays. The ultraviolet rays excite the phosphors on the surfaces of the discharge cell, and then, cause them to emit fluorescence. On the other hand, the gas molecules in the discharge cell ionize to cations and electrons, which accumulate on the surfaces of the discharge cell again. Accordingly, the gas discharge and fluorescence are repeated in the discharge cell at every reversal in polarity of the voltage between the sustain and scan electrodes. Thus, the discharge cells sustain the light emissions.

In a DC type PDP, light emissions occur as follows. First, the high voltage pulse is applied between the cathode and the anode. At that time, discharge in gas occurs in the discharge cell located at the intersection between those electrodes. Gas molecules in the discharge cell ionize to cations and electrons, which remain within the discharge cell, serving as priming particles. As a result, a breakdown voltage is reduced. Next, high voltage pulses (sustaining voltage pulses) are periodically applied to the cathode. At that time, discharge in gas occurs in the discharge cell in which the priming particles remain, since the breakdown voltage is lower than the peak of the sustaining voltage pulse. Gas molecules in the discharge cell ionize, and thereby, emit ultraviolet rays. The ultraviolet rays excite the phosphors on the surfaces of the discharge cell, and cause them to emit fluorescence. On the other hand, the gas molecules in the discharge cell ionize to cations and electrons, which remain again, serving as the priming particles. Accordingly, the gas discharge and fluorescence are repeated in the discharge cell at every application of the sustaining voltage pulse. Thus, the discharge cells maintain the light emissions.

A sustain driver is a device that applies sustaining voltage pulses to the electrodes of a PDP. For example, in an AC type PDP, the sustain driver is connected to the sustain electrodes. In a DC type PDP, the sustain driver is connected to the cathodes.

The sustaining voltage pulse is usually higher than 200 V. Transient potential fluctuations inside the device are further added to the voltage that the sustain driver should withstand. Reliable operation is required of the sustain driver under such high voltage conditions.

FIG. 8 is an equivalent circuit diagram that shows an example of a conventional sustain driver. See, for example, Published Japanese patent application Hei 4-230117 gazette. This sustain driver comprises a floating voltage generating circuit 30, a control circuit 100, and an output circuit 20.

The floating voltage generating circuit 30 controls each potential of four power supply terminals 2H, 2F, 2L, and 2G of the control circuit 100. Thereby, the high side power supply terminal 2H is maintained at a potential higher than the potential of the floating power supply terminal 2F, which is hereafter referred to as a floating voltage, by the voltage across the capacitor 33. Here, the voltage across the capacitor 33 is maintained at a constant value, for example, the voltage (for example, 15 V) of an internal constant-voltage source 31. The low side power supply terminal 2L is maintained at a constant potential, for example, a potential higher than the ground potential by the voltage (for example, 15 V) of the constant-voltage source 31. The low potential power supply terminal 2G is a ground terminal, for example, and is maintained at the ground potential.

The control circuit 100 receives two kinds of control signals, which are hereafter referred to as high and low side input signals, from the outside such as the main control section of the plasma display. The high side input signal is converted by the level shift circuit 4 and the high side circuit 5H into a control signal for a high side power MOSFET 22H inside the output circuit 20, which is hereafter referred to as a high side output signal. Here, the high side circuit 5H is generally a circuit with a MOSFET input, and operates on the voltage between the high side power supply terminal 2H and the floating power supply terminal 2F. The low side input signal is converted by the low side circuit 5L into a control signal for a low side power MOSFET 22L inside the output circuit 20, which is hereafter referred to as a low side output signal. Here, the low side circuit 5L operates on the voltage between the low side power supply terminal 2L and the low potential power supply terminal 2G.

In the output circuit 20, the two power MOSFETs 22H and 22L are connected in series between the high potential power supply terminal 21 and the ground terminal. Here, the high potential power supply terminal 21 is connected to an external constant-voltage source, and maintained at a predetermined high potential, for example, 200 V. The two power MOSFETs 22H and 22L are alternately turned on and off under the high and low side output signals, respectively. Thereby, the potential of the node of the MOSFETs or a voltage pulse output terminal 23 changes between two levels. The voltage pulse output terminal 23 is connected to the sustain electrodes of the PDP. Thus, the sustaining voltage pulses are applied to the sustain electrodes.

When the high side power MOSFET 22H is an n-channel MOSFET, for example, the floating power supply terminal 2F is connected to the node of the two power MOSFETs 22H and 22L, or the source of the high side power MOSFET 22H. Thereby, the level of the high side output signal with reference to the source of the high side power MOSFET 22H changes around the threshold value of the high side power MOSFET 22H, regardless of the turn-on or off of the high side power MOSFET 22H. In that case, the potential of the floating power supply terminal 2F, or the floating voltage changes between the ground potential (0 V) and the potential of the high potential power supply terminal 21 (for example, 200 V), in response to the turn-on and off of the two power MOSFETs 22H and 22L. In synchronism with the change, the high side power supply terminal 2H changes its potential. The range of the change is higher than the range of the floating voltage by a constant level, for example, 15-215 V.

During the period when the high side power MOSFET 22H is maintained in the ON state, the high side power supply terminal 2H is maintained at a potential higher than the potential of the high potential power supply terminal 21. When the high side input signal indicates the OFF state of the high side power MOSFET 22H, the transistor 4T inside the level shift circuit 4 is turned on. At that moment, the potential of the node of the transistor 4T and the high side circuit 5H, or an input terminal 5A of the high side circuit 5H abruptly drops from the neighborhood of the potential of the high potential power supply terminal 21 near to the ground potential. Thereby, very large and transient potential difference appears between the high side power supply terminal 2H and the input terminal 5A of the high side circuit 5H. The high side circuit 5H has generally a MOSFET input. The MOSFET input section 5B detects a change in the potential difference between the input terminal 5A of the high side circuit 5H and the high side power supply terminal 2H (or the floating power supply terminal 2F). If the potential difference, even transiently, exceeds any withstand level of the source-gate, drain-gate, and backgate-gate voltages of the MOSFETs included in the MOSFET input section 5B, the MOSFETs may malfunction. Furthermore, the MOSFETs may be at the risk of destruction. In addition, the malfunction of the high side circuit 5H leads the malfunction of the output circuit 20, and thus, spoils the reliability of the output circuit 20, and furthermore, increases the risk of the simultaneous turn-on of the two power MOSFET 2H and 2L. In that case, the two power MOSFET 2H and 2L may be destroyed by shoot-through current.

In the conventional control circuit 100, the anode and cathode of a Zener diode 70 are connected to the input terminal 5A of the high side circuit 5H and the high side power supply terminal 2H, respectively. The Zener diode 70 is turned on at the time when the potential difference between the high side power supply terminal 2H and the input terminal 5A of the high side circuit 5H reaches a constant breakdown voltage (Zener voltage). Thereby, the potential difference between the high side power supply terminal 2H and the input terminal 5A of the high side circuit 5H is clamped to the Zener voltage. Thus, the malfunction and destruction of the high side circuit 5H due to overvoltage are prevented. As a result, the high side circuit 5H operates reliably even if a high voltage of about 600 V, for example, is applied between the high side power supply terminal 2H and the input terminal 5A of the high side circuit 5H. In the conventional sustain driver as shown in FIG. 8, as described above, the Zener diode 70 connected between the high side power supply terminal 2H and the input terminal 5A of the high side circuit 5H protects the high side circuit 5H from overvoltage. The higher reliability this overvoltage protection has, the higher reliability the sustain driver has.

When the control circuit 100 of the sustain driver is configured as a single integrated circuit, for example, the base-emitter junction of an npn bipolar transistor is used as the above-described Zener diode 70. At the turn-on of the transistor 4T inside the level shift circuit 4, the reverse current flows through the Zener diode 70, or the above-described base-emitter junction. The voltage across the Zener diode 70 includes, in addition to the Zener voltage, the voltage drop due to the above-described reverse current and the resistance of the base-emitter junction against the reverse bias. For the overvoltage protection, it is desirable that the voltage drop across the Zener diode 70 is maintained sufficiently lower than the Zener voltage regardless of the amount of the reverse current, since the voltage across the Zener diode 70 is maintained substantially equal to the Zener voltage regardless of the amount of the reverse current. Accordingly, the above-described resistance of the Zener diode 70 has to be reduced for the further improvement in reliability of the overvoltage protection. However, a very larger area has to be allocated to the Zener diode 70 with the above-described resistance lower, in comparison with the areas of the other circuit elements, since the above-described resistance depends on the area of the PN junction inside the Zener diode 70. Thus, the maintenance of the high reliability of the overvoltage protection prevents the further higher integration of the control circuit 100. As a result, further miniaturization of the sustain driver and its resulting further reduction of the manufactures' costs are difficult.

BRIEF SUMMARY OF THE INVENTION

An object of the present invention is to provide a control circuit of a sustain driver that can achieve further improvements both in high integration and high reliability, by further improving the reliability of the overvoltage protection circuit with its area maintained small.

A plasma display according to the invention comprises a plasma display panel (PDP) and a sustain driver. The PDP includes: discharge cells emitting light due to electric discharge in gas contained inside said discharge cells; and electrodes applying a sustaining voltage pulse received from the outside to said discharge cells.

The sustain driver according to the invention is a device that applies the above-described sustaining voltage pulses to the electrodes of the PDP, and comprises a floating voltage generating circuit, an output circuit, and a control circuit.

The floating voltage generating circuit preferably includes first to fourth output terminals:

The first output terminal is maintained at a potential equal to or above a predetermined lower limit;

The second output terminal is maintained at a potential a constant voltage lower than the potential of the first output terminal;

The third output terminal is maintained at a constant potential;

The fourth output terminal is maintained at a potential a constant voltage lower than the potential of the third output terminal.

The floating voltage generating circuit further preferably includes:

a constant-voltage source connected between the third and fourth output terminals;

a diode with an anode connected to a positive electrode of the constant-voltage source and a cathode connected to the first output terminal; and a capacitor connected between the first and second output terminals.

The output circuit preferably comprises a high potential power supply terminal connected to an external constant-voltage source and maintained at a predetermined high potential, two output transistors connected in series between the high potential power supply terminal and the fourth output terminal of the floating voltage generating circuit, and turned on and off under high and low side output signals, and a voltage pulse output terminal connected between the node of the two output transistors and the electrodes of the PDP.

The control circuit according to the invention generates the high and low side output signals under a control signal received from the outside, and sends the output signals to the above-described output circuit. This control circuit preferably comprises a high side power supply terminal connected to the first output terminal of the floating voltage generating circuit, a floating power supply terminal connected to the second output terminal of the floating voltage generating circuit, a low side power supply terminal connected to the third output terminal of the floating voltage generating circuit, a low potential power supply terminal connected to the fourth output terminal of the floating voltage generating circuit, an input circuit generating high and low side control signals based on the above-described control signal, a level shift circuit including a resistance element with a first terminal connected to the high side power supply terminal, and a level shift transistor connected between a second terminal of the resistance element and the low potential power supply terminal and changing the potential of the second terminal of the resistance element under the high side control signal, a high side circuit including an input terminal connected to the second terminal of the resistance element and converting a potential change of the input terminal into the high side output signal, by using the potential difference between the high side and floating power supply terminals, a low side circuit converting the low side control signal into the low side output signal, by using the potential difference between the low side and low potential power supply terminals, and a bipolar transistor circuit including a collector connected to the high side power supply terminal, an emitter connected to the input terminal of the high side circuit, and a base connected to the floating power supply terminal.

The bipolar transistor circuit preferably includes a Darlington connection of at least two bipolar transistors. Further preferably, the Darlington connection includes first and second bipolar transistors. In that case:

the above-described collector is a common collector of the first and second bipolar transistors;

the above-described emitter is the emitter of the second bipolar transistor;

the above-described base is the base of the first bipolar transistor; and the emitter of the first bipolar transistor is connected to the base of the second bipolar transistor.

In the above-described bipolar transistor circuit, alternatively, three and more bipolar transistors may be combined into a repetitive pattern of the similar Darlington connections. In addition, the above-described bipolar transistor circuit may be composed of a single bipolar transistor.

In the above-described control circuit according to the invention, the base current flows into the bipolar transistor circuit when the level shift transistor is turned on with the high side power supply terminal maintained at a high potential. Thereby, the bipolar transistor circuit is turned on. At that time, the collector current of the bipolar transistor circuit supplies the most part of the current flowing into the level shift transistor. On the other hand, the base current is maintained sufficiently small, regardless of the amount of the current flowing into the level shift transistor. As a result, the base-emitter voltage of the bipolar transistor circuit is maintained sufficiently low. In other words, the input terminal of the high side circuit is maintained at the potential substantially equal to the potential of the floating power supply terminal. Therefore, the bipolar transistor circuit has the reliability higher than that of the conventional overvoltage protection circuit that uses a Zener diode. Furthermore, the bipolar transistor circuit is easier to miniaturize than the conventional overvoltage protection circuit, since its current capacity for the base current may be small. Thus, the above-described control circuit according to the invention can achieve further improvements both in high reliability and high integration, in contrast to the conventional circuits.

When the above-described control circuit according to the invention is configured as an integrated circuit on a common substrate, preferably:

the high side circuit and the bipolar transistor circuit are surrounded by a p type separation region; and the bipolar transistor circuit includes an n type epitaxial layer connected to the high side power supply terminal, a first p type diffusion region formed within the n type epitaxial layer and connected to the floating power supply terminal, a first n type diffusion region formed within the first p type diffusion region, a second p type diffusion region formed within the n type epitaxial layer and connected to the first n type diffusion region, and a second n type diffusion region formed within the second p type diffusion region and connected to the input terminal of the high side circuit.

The n type epitaxial layer, the second n type diffusion region, and the first n type diffusion region is used as collector, emitter, and base regions of the bipolar transistor circuit, respectively. As described above, the base current is maintained much smaller than the collector current. Accordingly, the first p and n type diffusion regions may be rather smaller than the other diffusion regions. Thus, the bipolar transistor circuit according to the invention is easy to miniaturize with high reliability maintained.

In the above-described control circuit according to the invention, preferably, either of the high side and floating power supply terminals is connected to the output circuit, so that each potential of the high side and floating power supply terminals may exhibit a change pattern similar to that of the sustaining voltage pulse. In that case, the level of the high side output signal is adjusted with reference to either potential of the high side and floating power supply terminals. Accordingly, the level of the high side output signal changes in a stable pattern around the threshold value of the high side output transistor, regardless of the turn-on or off of the high side output transistor.

On the other hand, the frequency rise of the sustaining voltage pulse, for example, is desirable for the improvement in high image quality of the PDP. The frequency rise of the sustaining voltage pulse causes, at the high side power supply terminal of the sustain driver, the transient voltage fluctuations to be reckoned with, due to the inductance components of the conducting paths. In particular, the potential of the high side power supply terminal can transiently fall below the potential of the input terminal of the high side circuit.

In the above-described control circuit according to the invention, further preferably, the level shift circuit comprises a reverse current blocking diode inserted between the high side power supply terminal and the level shift transistor and cutting off the current flowing in the direction from the level shift transistor to the high side power supply terminal. When the potential of the high side power supply terminal falls below the potential of the input terminal of the high side circuit, the reverse current blocking diode prevents the reverse current from flowing from the level shift transistor to the high side power supply terminal. Thereby, the occurrence of the excessive voltage drop across the resistance element due to the reverse current is avoided. Thus, the high side circuit is protected from the transient overvoltage as well. Accordingly, the above-described control circuit according to the invention can maintain further high reliability.

When the control circuit according to the invention is configured as the above-described integrated circuit on the substrate, preferably, the reverse current blocking diode includes: a third p type diffusion region formed within the n type epitaxial layer and connected to the high side power supply terminal; and a third n type diffusion region formed within the third p type diffusion region and connected to the input terminal of the high side circuit. In this control circuit, the reverse current blocking diode and the resistance element are arranged within the above-described n type epitaxial layer, together with the above-described bipolar transistor circuit, and separated from the outside by the above-described p type separation region. As a result, the above-described control circuit according to the invention has a further higher packing density.

In the control circuit of the sustain driver according to the invention, as described above, the bipolar transistor circuit is used for the overvoltage protection of the high side circuit. Thereby, the reliability of the overvoltage protection circuit further improves with its area maintained small. In other words, the control circuit according to the invention can further improve both in high integration and high reliability, in contrast to the conventional circuit.

The improvement in high reliability of the control circuit greatly contributes to the improvement in high reliability of the output circuit, and in particular, effectively prevents the destruction of the output transistor due to the shoot-through current. On the other hand, the further higher integration of the control circuit further reduces its chip size. As a result, the manufactures' costs of the sustain driver, and further of the plasma display, can be reduced.

While the novel features of the invention are set forth particularly in the appended claims, the invention, both as to organization and content, will be better understood and appreciated, along with other objects and features thereof, from the following detailed description taken in conjunction with the drawings.

Figure 1:
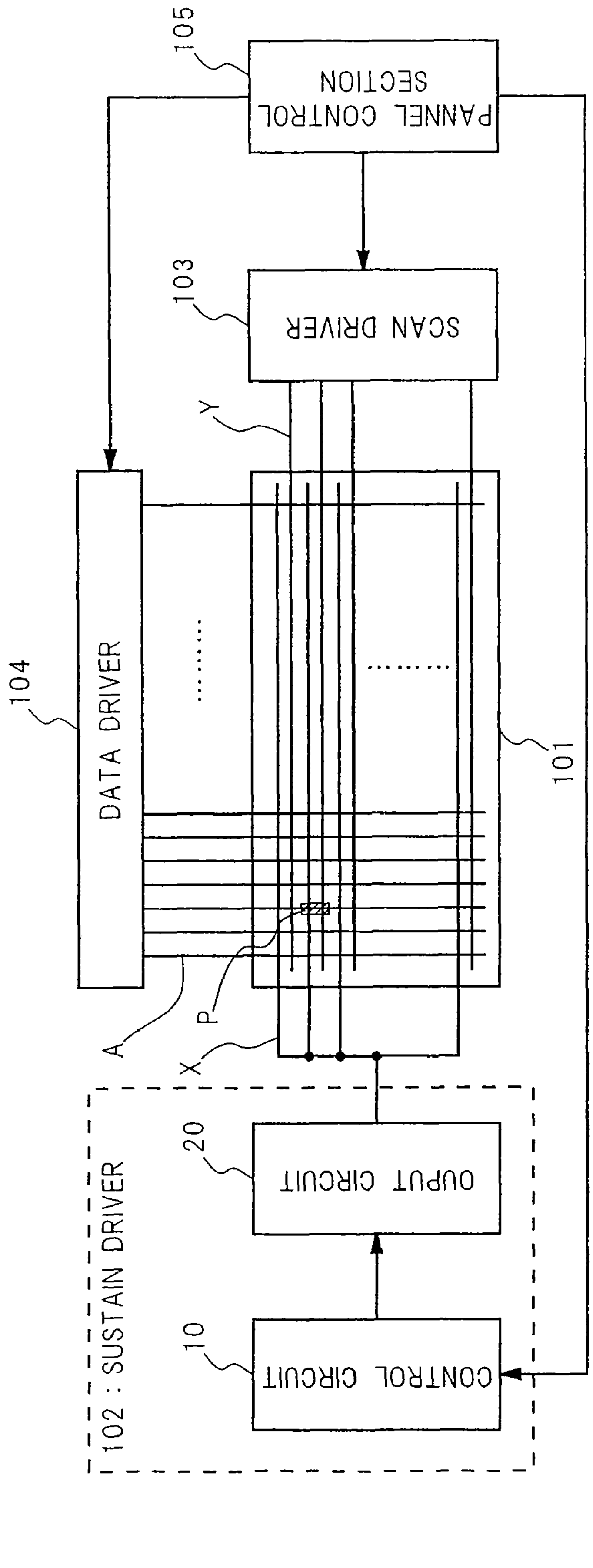
FIG. 1 is a block diagram that shows the configuration of a plasma display according to Embodiment 1 of the invention.

It will be recognized that some or all of the Figures are schematic representations for purposes of illustration and do not necessarily depict the actual relative sizes or locations of the elements shown.

DETAILED DESCRIPTION OF THE INVENTION

The following explains the best embodiments of the present invention, referring to the figures.

Embodiment 1

A plasma display according to Embodiment 1 of the present invention comprises a PDP 101, a sustain driver 102, a scan driver 103, a data driver 104, and a panel control section 105. See FIG. 1.

The PDP 101 is preferably an AC type and comprises a three-electrode surface-discharge type structure. Three by n (n: integer) address electrodes A are arranged on the rear substrate of the PDP 101 in the vertical direction of the panel. m (m: integer) sustain electrodes X and m scan electrodes Y are alternately arranged on the front substrate of the PDP 101 in the horizontal direction of the panel. The sustain electrodes X are connected to each other and accordingly, maintained at substantially equal potentials. As for the address and scan electrodes Y, each electrode allows an individual potential change. A discharge cell P is installed at the intersection of the adjacent pair of the sustain electrode X and the scan electrode Y and the address electrode A. Gas fills the inside of the discharge cell P. On the surface of the discharge cell P, a layer of dielectric material (a dielectric layer), a layer protecting the electrodes and the dielectric layer (a protection layer), and a layer including phosphor (a phosphor layer) are laminated. A phosphor that emits red, green, or blue fluorescence is put in the phosphor layer of each discharge cell. Thereby, each discharge cell establishes one of RGB sub-pixels. The three, RGB sub-pixels constitute one pixel. Accordingly, the pixels are arranged on the PDP 101 in a lattice pattern with m lines by n columns. The sustain driver 102 changes the potentials of all the sustain electrodes X of the PDP 101 at the same time, and in particular, periodically repeats the application of the sustaining voltage pulse to all the sustain electrodes X for a predetermined time. The scan driver 103 separately changes each potential of the scan electrodes Y of the PDP 101, and in particular, applies scanning voltage pulses to the scan electrodes Y in a predetermined order. The data driver 104 separately changes each potential of the address electrodes A of the PDP 101, and in particular, stores a video signal line by line, selects an address electrode placed on a column where the sub-pixel to glow exists, and applies an address voltage pulse to the address electrode selected. The panel control section 105 controls the timings of the voltage pulses applied by the sustain driver 102, the scan driver 103, and the data driver 104, preferably in compliance with the ADS scheme.

The ADS (Address Display-period Separation) scheme is a kind of the sub-field scheme. One field of the image is divided into a plurality of sub-fields (for example, 8-12 sub-fields) in the ADS scheme. During each sub-field, reset, address, and sustain periods are provided in common for all the discharge cells of the PDP 101. During the reset period, a reset voltage pulse is applied between the sustain electrode X and the scan electrode Y. Thereby, the wall charges are evened among all the discharge cells. Here, a reset voltage pulse is generated by a specific circuit included in either the sustain driver 102 or the scan driver 103, or both, which is not shown in FIG. 1. During the address period, scanning voltage pulses are applied to the scan electrodes Y in a predetermined order, for example, starting from the top. In synchronism with the application of the scanning voltage pulse to each scan electrode Y, an address voltage pulse is applied to the address electrode A that is selected based on the line of the video signal that corresponds to the scan electrode Y. A discharge in gas occurs in the discharge cell located at the intersection of the scan electrode provided with the scanning voltage pulse and the address electrode provided with the address voltage pulse. The gas molecules in the discharge cell ionize to cations and electrons, which stick to the surfaces of the discharge cell. Thus, the wall charges accumulate on the surfaces of the discharge cell. During the sustain period, the sustain driver periodically applies sustaining voltage pulses to the sustain electrodes X. On the other hand, the scan driver maintains the scan electrode Y at, for example, a potential around a half of the peak of the sustaining voltage pulse. Thereby, in each discharge cell, a high voltage appears between the sustain electrode X and the scan electrode Y and its polarity is periodically reversed. In the discharge cell where the wall charges have accumulated during the address period, in particular, discharge in gas occurs due to the sum of the voltage induced by the wall charges and the sustaining voltage pulse. The gas molecules ionize, and thereby, emit ultraviolet rays in the discharge cell. The ultraviolet rays excite the phosphors on the surfaces of the discharge cell and cause them to emit one of RGB fluorescence. On the other hand, the gas molecules in the discharge cell ionize to cations and electrons, which accumulate again on the surfaces of the discharge cell. Accordingly, in the discharge cell, the gas discharge and the fluorescence emission are repeated at every reversal in polarity of the voltage between the sustain electrode X and the scan electrode Y. Thus, the light emission of the discharge cell is sustained. The length of the sustain period varies from one sub-field to another. The panel control section 105, according to the brightness of the sub-pixel specified by the video signal, selects a light emission time per field of the corresponding discharge cell, that is, a sub-field in which the discharge cell should glow. Thus, the image corresponding to the video signal is reproduced on the PDP 101.

The PDP 101 shown in FIG. 1 is the AC type. In that case, the sustain electrode X and the scan electrode Y of the PDP 101 are connected to the respective sustain drivers 102. Alternatively, the PDP may be a DC type. In a DC pulse memory type, for example, the cathodes on the front substrate are connected to the sustain and scan drivers, and the anodes on the rear substrate are connected to the address driver. The sustain driver periodically applies sustaining voltage pulses to the cathodes.

The sustain driver 102 includes a control circuit 10 and an output circuit 20. The control circuit 10 receives a control signal from the panel control section 105 and, based on the control signal, generates and sends high and low side output signals to the output circuit 20. The output circuit 20 receives the high and low side output signals from the control circuit 10 and, under the signals, changes the potential of the sustain electrodes X of the PDP 101 between two levels.

The sustain driver 102 preferably comprises the following circuitry. See FIG. 2. The sustain driver 102 comprises a floating voltage generating circuit 30 in addition to the control circuit 10 and the output circuit 20.

The output circuit 20 comprises a high potential power supply terminal 21, two output transistors 22H and 22L, and a voltage pulse output terminal 23. The high potential power supply terminal 21 is connected to an external constant-voltage source and maintained at a predetermined high potential, for example, 200 V. Any of the two output transistors 22H and 22L is, preferably, an (enhancement type) n channel power MOSFET. The two output transistors 22H and 22L are connected in series between the high potential power supply terminal 21 and the ground terminal, and constitute a so-called EE-type NMOS inverter. Alternatively, they may constitute a CMOS inverter. Furthermore, the output transistors 22H and 22L each may be an IGBT. The two output transistors 22H and 22L are alternately turned on and off under the high and low side output signals that the control circuit 10 applies to their respective gates. In synchronism with the turning-on and off, the potential of the node of the two output transistors 22H and 22L changes between the high potential (200 V) of the high potential power supply terminal 21 and the ground potential (0 V). The voltage pulse output terminal 23 connects between the node of the two output transistors 22H and 22L and the sustain electrode X of the PDP 101. Thereby, the potential fluctuations of the node of the two output transistors 22H and 22L are transmitted to the sustain electrodes X of the PDP 101 as sustaining voltage pulses. Here, the upper and lower limits of the sustaining voltage pulse are equal to the high potential (200 V) of the high potential power supply terminal 21, and the ground potential (0 V), respectively.

The floating voltage generating circuit 30 includes the first to fourth output terminals. The first to fourth output terminals are connected to four power supply terminals of the control circuit 10; a high side power supply terminals 2H, a floating power supply terminal 2F, a low side power supply terminal 2L, and a low potential terminal 2G, respectively. The floating voltage generating circuit 30 further comprises a constant-voltage source 31, a diode 32, and a capacitor 33. The constant-voltage source 31 maintains the potential of its positive electrode a constant level higher than the potential of its negative electrode. The constant level is set at a level sufficiently lower than the upper limit of the sustaining voltage pulse, and preferably, at a level equal to or above the threshold voltage of the output transistor 22H and 22L, for example, 15 V. The negative electrode of the constant-voltage source 31 is grounded together with the low potential terminal 2G, and the positive electrode of the source is connected to the low side power supply terminal 2L and the anode of the diode 32. The cathode of the diode 32 is connected to the high side power supply terminal 2H. Thereby, the potential of the high side power supply terminal 2H is maintained equal to or above the potential of the positive electrode of the constant-voltage source 31, and in other words, can not fall below the potential, exceeding the forward-biased voltage of the diode 32. On the other hand, the low side power supply terminal 2L is maintained at the constant potential equal to the potential of the positive electrode of the constant-voltage source 31. The floating power supply terminal 2F is connected to the node of the two output transistors 22H and 22L. Thereby, the potential of the floating power supply terminal 2F, which is hereafter referred to as a floating voltage, changes between the high potential (200 V) of the high potential power supply terminal 21 and the ground potential (0 V), in response to the turning-on and off of the output transistors 22H and 22L. The capacitor 33 is connected between the high side power supply terminal 2H and the floating power supply terminal 2F. Every time the floating voltage falls to the neighborhood of the ground potential, the diode 32 is turned on and the capacitor 33 stores charges due to the current from the constant-voltage source 31. Thereby, the voltage across the capacitor 33 is maintained at a substantially constant level or the voltage of the constant-voltage source 31 (15 V). Accordingly, the potential difference between the high side power supply terminal 2H and the floating power supply terminal 2F is maintained substantially equal to the voltage across the capacitor 33, or the voltage of the constant-voltage source 31 (15 V). Therefore, the potential of the high side power supply terminal 2H changes in synchronism with the change of the floating voltage. The range of the potential change of the high side power supply terminal 2H is higher than the range in change of the floating voltage (0-200 V) by the voltage of the constant-voltage source 31 (15-215 V).

Figure 2:
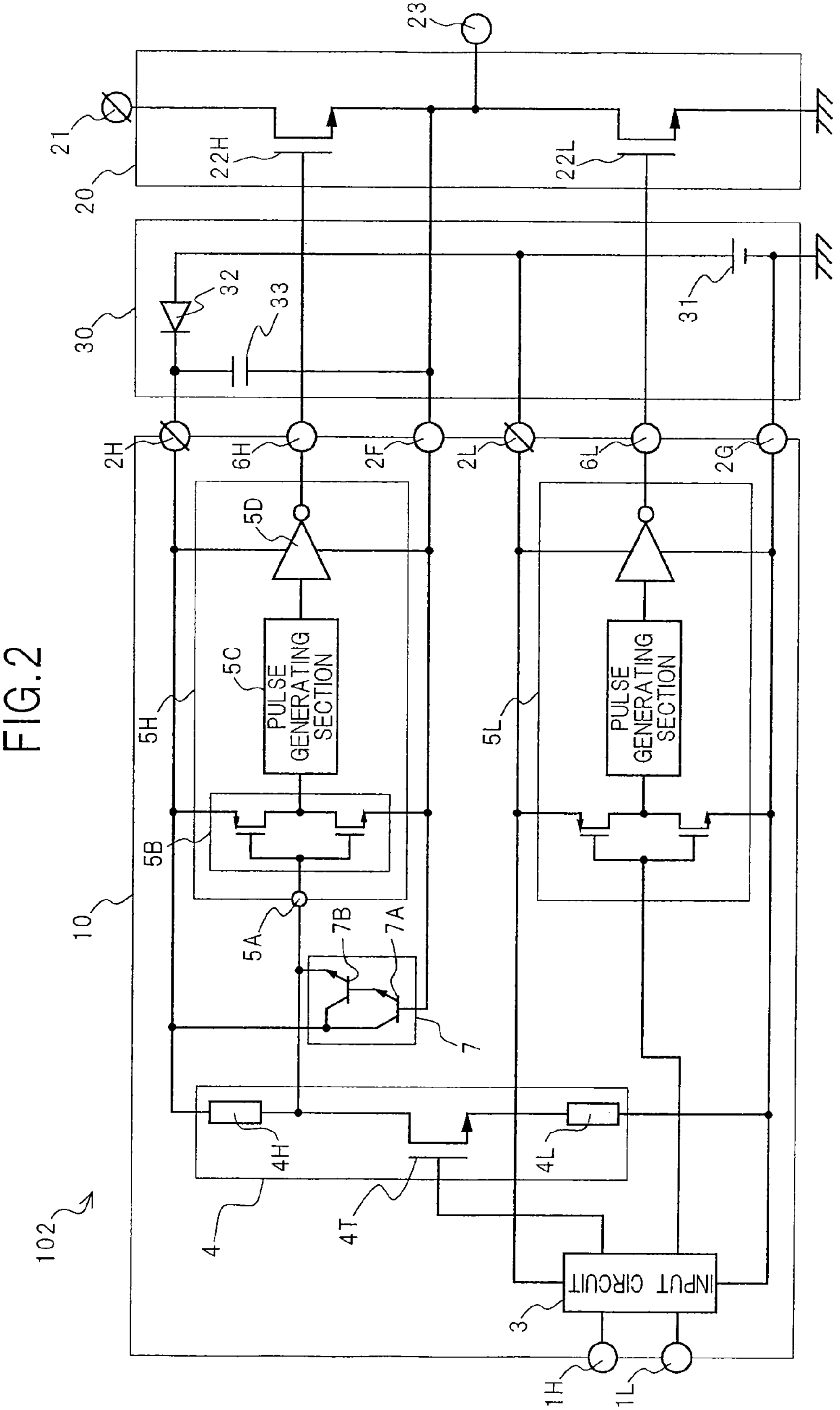
FIG. 2 is an equivalent circuit diagram that shows a sustain driver 102 according to Embodiment 1 of the invention.

The control circuit 10 comprises two input terminals 1H and 1L, an input circuit 3, two level shift circuits 4, a high side circuit 5H, a low side circuit 5L, two output terminals 6H and 6L, and two overvoltage protection circuits 7, in addition to the above-described four power supply terminals 2H, 2F, 2L, and 2G. In FIG. 2, one of the two level shift circuits 4 and one of the two overvoltage protection circuits 7 are only illustrated for the sake of simplicity.

The two input terminals 1H and 1L receive high and low side input signals from the outside and transmit the signals to the input circuit 3, respectively. Here, any of the high and low side input signals is preferably a fixed rectangular pulse. Of the input signals, for example, the rising edges indicate the timings of the turn-on of the output transistors 22H and 22L, while the falling edges indicate the timings of the turn-off of the output transistors 22H and 22L.

The high and low side input signals, preferably, are generated by a signal converting circuit (not shown) inserted between the control circuit 10 and the panel control section 105, based on the control signal sent from the panel control section 105. The signal converting circuit, for example, adjusts the phase difference between the high and low side input signals, and thereby compensates for the variation of the phase difference between the high and low side output signals caused by the difference in the signal processing performed in the control circuit 10. Alternatively, the panel control section 105 may generate the high and low side input signals, and send them directly to the control circuit 10.

The input circuit 3, using the voltage between the low side power supply terminal 2L and the low potential terminal 2G, converts the high and low side input signals into the high and low side control signals, respectively, as follows. At first, the input circuit 3 shifts each pulse height (for example, 5 V) of the high and low side input signals to the appropriate level. The low side input signal having undergone the level shift is sent to the low side circuit 5L as a low side control signal. The low side control signal, for example, indicates the turning-on/off of the low side output transistor 22L by the rising/falling edges, respectively, similarly to the low side input signal. Next, the input circuit 3 generates two kinds of rectangular pulses, which are hereafter referred to as front and rear edge pulse signals, in synchronism with the front and rear edges of the high side input signal having undergone the level shift, respectively. Here, the front and rear edge pulse signals both have the pulse widths much narrower than that of the high side input signal. The front and rear edge pulse signals indicate the timings of the turn-on and off of the high side output transistor 22H, respectively. The two kinds of edge pulse signals are sent to the two level shift circuits 4, serving as high side control signals. In addition, the input circuit 3, by its logical operation, maintains the low side control signal at a low level, for example, during the period from the generation of the front edge pulse signal till the generation of the rear edge pulse signal. Thereby, the two output transistors 22H and 22L are prohibited from turning on at the same time, and thus, protected from the destruction due to the shoot-through current.

There are two of the level shift circuits 4 comprising the similar configuration. The two level shift circuits 4 receive the front and rear edge pulse signals, respectively. The level shift circuits 4 each include a level shift transistor 4T and two resistance elements 4H and 4L. The level shift transistor 4T is preferably an n-channel MOSFET, or alternatively, may be a p-channel MOSFET, IGBT, or a bipolar transistor. The drain of the level shift transistor 4T is connected through a pull-up resistance element 4H to the high side power supply terminal 2H. The source of the level shift transistor 4T is connected through the source resistance element 4L to the low potential power supply terminal 2G, or grounded. When the level shift transistor 4T maintains the ON state, the voltage drop across the source resistance element 4L restricts the lower limit of the source potential of the level shift transistor 4T. Thereby, the operation of the level shift transistor 4T becomes stable. Here, the source resistance elements 4L may be eliminated when the stability of the level shift transistor 4T is high enough. In other words, the source of the level shift transistor 4T may be connected directly to the low potential terminal 2G, and thus grounded. The gate of the level shift transistor 4T is connected to the input circuit 3 and receives the high side control signal. Here, the high side control signal is, preferably, set at a pulse height equal to or above the threshold voltage of the level shift transistor 4T. When the level shift transistor 4T maintains the OFF state, the drain potential of the level shift transistor 4T, which is hereafter referred to as a level shift voltage, is maintained equal to the potential of the high side power supply terminal 2H. When the level shift transistor 4T is turned on under the high side control signal, the drain current flows through the pull-up resistance element 4H. At that time, the level shift voltage falls from the potential of the high side power supply terminal 2H by the voltage drop across the pull-up resistance element 4H. In such a manner, the level shift voltage changes under the high side control signal.

The potential difference between the high side power supply terminal 2H and the low potential terminal 2G can reach the potential difference between the high potential power supply terminal 21 and the low potential terminal 2G. Accordingly, the withstand voltage of the level shift transistor 4T must be high enough. Furthermore, the drain current is generally large. Accordingly, the current capacity of the level shift transistor 4T must be large enough. However, the pulse width of the high side control signal is much shorter than the pulse width of the high side input signal, and therefore, the ON time of the level shift transistor 4T is much shorter than the ON time of the high side output transistor 22H. In other words, the duration of the drain current is very short. As a result, the conduction loss of the level shift circuit 4 is low, regardless of the amount of the drain current.

Only one of the level shift circuits 4 may be installed when the conduction loss of the level shift circuit 4 due to the drain current is low enough. In that case, the high side input signal having undergone the level shift by the input circuit 3 is sent to the level shift circuit 4, serving as the high side control signal.

The high side circuit 5H includes two input terminals 5A, two MOSFET input sections 5B, a pulse generating section 5C, and an output buffer 5D. In FIG. 2, one of the two input terminals 5A and one of the two MOSFET input sections 5B are only shown for the sake of simplicity. Each of the two input terminals 5A is connected to one of the drains of the level shift transistors 4T. Thereby, the potentials of the input terminals 5A change in a manner similar to that of the respective level shift voltages. The MOSFET input section 5B is an inverter that includes the series connection of two MOSFETs and, for example, is a CMOS inverter, or alternatively, may be an EE-type NMOS inverter. Furthermore, each of the MOSFETs may be replaced with an IGBT. The MOSFET input section 5B is connected between the high side power supply terminal 2H and the floating power supply terminal 2F, and the gate of each MOSFET is connected to the input terminal 5A. The resistance value of the pull-up resistance element 4H is set such that the range of the potential change of the input terminal 5A may exceed the threshold voltage of each MOSFET in the MOSFET input section 5B. The output voltage of the MOSFET input section 5B is equal to the floating voltage when the potential of the input terminal 5A is equal to the potential of the high side power supply terminal 2H. The output voltage of the MOSFET input section 5B rises to the potential of the high side power supply terminal 2H when the potential of the input terminal 5A falls by the voltage drop across the pull-up resistance element 4H. The pulse generating section 5C detects both output voltages of the two MOSFET input sections 5B. The two MOSFET input sections 5B activate their output voltages in response to the front and rear edge pulse signals, respectively. The pulse generating section 5C, for example, changes its output voltage into the low and high levels, in response to the rising edges of the former and latter output voltages, respectively. The output buffer 5D converts the output voltage of the pulse generating section 5C into the high side output signal, based on the voltage between the high side power supply terminal 2H and the floating power supply terminal 2F. The output buffer 5D is, preferably, an inverter. In that case, the high and low levels of the high side output signal are equal to the potential of the high side power supply terminal 2H and the floating voltage, respectively. Alternatively, the high level of the high side output signal may be several volts lower than the potential of the high side power supply terminal 2H. However, the difference between the high and low levels of the high side output signal, that is, the pulse height of the signal is set equal to or above the threshold voltage of the high side output transistor 22H. The high side output terminal 6H connects the output buffer 5D to the gate of the high side output transistor 22H. Thereby, the high side output signal is transmitted to the gate of the high side output transistor 22H. The high side output transistor 22H is turned on and off at the rising and falling edges of the high side output signal, respectively.

The floating power supply terminal 2F is connected to the node of the two output transistors 22H and 22L, that is, the source of the high side output transistor 22H. On the other hand, the high side circuit 5H adjusts the level of the high side output signal with reference to the floating voltage. Thereby, the level of the high side output signal changes around the threshold value of the high side output transistor 22H in a stable pattern, regardless of the turn-on or off of the high side output transistor 22H.

The low side circuit 5L has a configuration similar to that of the high side circuit 5H. However, there may be one each of the input terminal and the MOSFET input section. The low side circuit 5L shapes the pulse of the low side control signal based on the voltage between the low side power supply terminal 2L and the low potential power supply terminal 2G, that is, the voltage of the constant-voltage source 31 (15 V), and converts the pulse into the low side output signal. For example, the high and low levels of the low side output signal are equal to the voltage of the constant-voltage source 31 and the ground potential, respectively. Alternatively, the high level of the low side output signal may be several volts lower than the voltage of the constant-voltage source 31. However, the difference between the high and low levels of the low side output signal, that is, the pulse height of the signal is set equal to or above the threshold voltage of the low side output transistor 22L. The low side output terminal 6L connects the low side circuit 5L to the gate of the low side output transistor 22L. Thereby, the low side output signal is transmitted to the gate of the low side output transistor 22L. The low side output transistor 22L is turned on and off in response to the rising and falling edges of the low side output signal, respectively.

The high side circuit 5H operates on the potential difference between the high side power supply terminal 2H and the floating power supply terminal 2F. The potential difference is maintained at the voltage across the capacitor 33, or the voltage of the constant-voltage source 31 (15 V), regardless of the floating voltage. The low side circuit 5L operates on the potential difference between the low side power supply terminal 2L and the low potential power supply terminal 2G, that is, the voltage of the constant-voltage source 31. Accordingly, for both of the high side circuit 5H and the low side circuit 5L, the internal circuit elements with stand voltages around the voltage of the constant-voltage source 31 may be sufficient. Therefore, both of the high side circuit 5H and the low side circuit 5L are easy to miniaturize.

One of the overvoltage protection circuits 7 is installed for each pair of the level shift circuit 4 and the input terminal 5A of the high side circuit 5H. Each of the overvoltage protection circuits 7 includes a bipolar transistor circuit. The bipolar transistor circuit 7 is preferably a circuit equivalent to a Darlington connection of first and second bipolar transistors 7A and 7B, and includes three terminals of collector, emitter, and base, similarly to a single bipolar transistor. The collector of the bipolar transistor circuit 7 is the common collector of the first and second bipolar transistors 7A and 7B, and connected to the high side power supply terminal 2H. The emitter of the bipolar transistor circuit 7 is the emitter of the second bipolar transistor 7B, and connected to the input terminal 5A of the high side circuit 5H. The base of the bipolar transistor circuit 7 is the base of the first bipolar transistor 7A, and is connected to the floating power supply terminal 2F. Furthermore, the emitter of the first bipolar transistor 7A is connected to the base of the second bipolar transistor 7B. Alternatively, in the bipolar transistor circuit 7, three or more bipolar transistors may be combined into a repetitive pattern of similar Darlington connections. The bipolar transistor circuit 7 may be further composed of a single bipolar transistor.

A base current flows through the bipolar transistor circuit 7 when the potential of the input terminal 5A of the high side circuit 5H falls below the floating voltage due to the turn-on of the level shift transistor 4T. Furthermore, the potential of the input terminal 5A of the high side circuit 5H is clamped to a potential lower than the floating voltage by the base-emitter voltage of the bipolar transistor circuit 7. Then, the base current turns on the two bipolar transistors 7A and 7B inside the bipolar transistor circuit 7. Thereby, a collector current flows through the bipolar transistor circuit 7 from the high side power supply terminal 2H to the drain of the level shift transistor 4T. The collector current of the bipolar transistor circuit 7 supplies the most part of the drain current of the level shift transistor 4T. On the other hand, the base current itself is maintained small enough, regardless of the amount of the drain current of the level shift transistor 4T. Accordingly, the base-emitter voltage is maintained low enough. As a result, in the MOSFET input section 5B of the high side circuit 5H, any of the voltages across the terminals of each MOSFET does not exceed its withstand voltage. Thus, the bipolar transistor circuit 7 prevents the MOSFET input section 5B from a malfunction and destruction due to an overvoltage. In the bipolar transistor circuit 7, in particular, the base current is small enough, regardless of the drain current of the level shift transistor 4T, and therefore, the bipolar transistor circuit 7 has high reliability. Furthermore, the bipolar transistor circuit 7 is easier to miniaturize than conventional overvoltage protection circuits, since its current capacity for the base current can be small.

The control circuit 10 controls the output circuit 20 under the high and low side input signals so as to cause it to generate the sustaining voltage pulse. The high and low side input signals are alternately generated at a fixed frequency, based on the control signal sent from the panel control section 105 (cf. FIG. 1). Here, both the input signals are controlled not to become a high level at the same time.

When the low side input signal rises, the input circuit 3 activates the low side control signal, and then, the low side circuit 5L activates the low side output signal. Thereby, the low side output transistor 22L is turned on, and then, the voltage pulse output terminal 23 is grounded. At that time, the potential of the sustain electrode X of the PDP 101 connected to the voltage pulse output terminal 23 falls to the ground potential. On the other hand, the high side input signal maintains a low level. In the two level shift circuits 4, the level shift transistor 4T maintains the OFF state and the high side output transistor 22H maintains the OFF state. The floating voltage falls to the ground potential. The potential of the high side power supply terminal 2H and the level shift voltage both fall to a high potential (15 V) higher than the ground voltage by the voltage across the capacitor 33. Accordingly, the high side circuit 5H maintains the high side output signal at the low level, or the floating voltage (in this case, the ground potential). Furthermore, the diode 32 is turned on, and then the voltage across the capacitor 33 matches with the voltage (15 V) of the constant-voltage source 31.

When the low side input signal falls, the input circuit 3 deactivates the low side control signal, and then the low side circuit 5L deactivates the low side output signal. Thereby, the low side output transistor 22L is turned off, and accordingly, separates from the ground terminal the voltage pulse output terminal 23 and the sustain electrode X of the PDP 101 connected to the voltage pulse output terminal 23.

When the high side input signal rises, the input circuit 3 sends the front edge pulse signal to one of the level shift circuits 4. In the level shift circuit 4, the level shift transistor 4T is turned on. The pulse width of the front edge pulse signal is very narrow, and thereby, the ON time of the level shift transistor 4T is very short. Accordingly, one of the level shift voltages, only for a moment, falls to the ground potential. Here, the floating voltage is around the ground potential, and the potential of the high side power supply terminal 2H is higher than the ground potential approximately by the voltage of the constant-voltage source 31. Accordingly, the current flowing through the overvoltage protection circuit 7 is small. Furthermore, in the MOSFET input section 5B inside the high side circuit 5H, the voltages across the terminals of each MOSFET do not exceed the withstand voltages. In the high side circuit 5H, one of the MOSFET input sections 5B raises its output voltage only for a moment. Thereby, the pulse generating section 5C changes its output voltage into a low level, and then, the output buffer 5D activates the high side output signal. Accordingly, the high side output transistor 22H is turned on and connects the voltage pulse output terminal 23 to the high potential power supply terminal 21. At that time, the potential of the sustain electrode X of the PDP 101 connected to the voltage pulse output terminal 23 rises to the potential of the high potential power supply terminal 21. On the other hand, the low side input signal maintains a low level and the low side circuit 5L maintains the low side output signal at the low level (the ground potential). Accordingly, the low side output transistor 22L maintains the OFF state. The floating voltage rises to the potential of the high potential power supply terminal 21 (200 V). The potential of the high side power supply terminal 2H and the level shift voltage both rise to a level (215 V) higher than the floating voltage or the potential of the high potential power supply terminal 21 by the voltage across the capacitor 33.

When the high side input signal falls, the input circuit 3 sends the rear edge pulse signal to another of the level shift circuits 4. In the level shift circuit 4, the level shift transistor 4T is turned on. The pulse width of the rear edge pulse signal is very narrow, and thereby the ON time of the level shift transistor 4T is very short. Accordingly, another of the level shift voltages falls only for a moment. Here, the floating voltage is approximately the potential of the high potential power supply terminal 21, and furthermore, the potential of the high side power supply terminal 2H is higher than that approximately by the voltage of the constant-voltage source 31. Accordingly, upon the turn-on of the level shift transistor 4T, the level shift voltage abruptly drops to the floating voltage. At that moment, the base current flows through the bipolar transistor circuit 7. Thereby, the level shift voltage is clamped to the neighborhood of the floating voltage. Furthermore, the bipolar transistor circuit 7 is turned on and then, the collector current supplies the drain current of the level shift transistor 4T. Accordingly, the level shift voltage is maintained with stability around the floating voltage with the base current maintained small. As a result, in the MOSFET input section 5B inside the high side circuit 5H, the voltages across the terminals of each MOSFET do not exceed the withstand voltages. In the high side circuit 5H, another of the MOSFET input sections 5B raises its output voltage only for a moment.

Thereby, the pulse generating section 5C changes its output voltage into a high level, and then the output buffer 5D deactivates the high side output signal. Accordingly, the high side output transistor 22H is turned off, and thus, separates the high potential power supply terminal 21 from the voltage pulse output terminal 23 and the sustain electrode X of the PDP 101 connected to the voltage pulse output terminal 23.

By the above-described operations repeated, the sustaining voltage pulses are periodically applied from the output circuit 20 to the sustain electrodes X of the PDP 101 connected to the voltage pulse output terminal 23.

Figure 3:
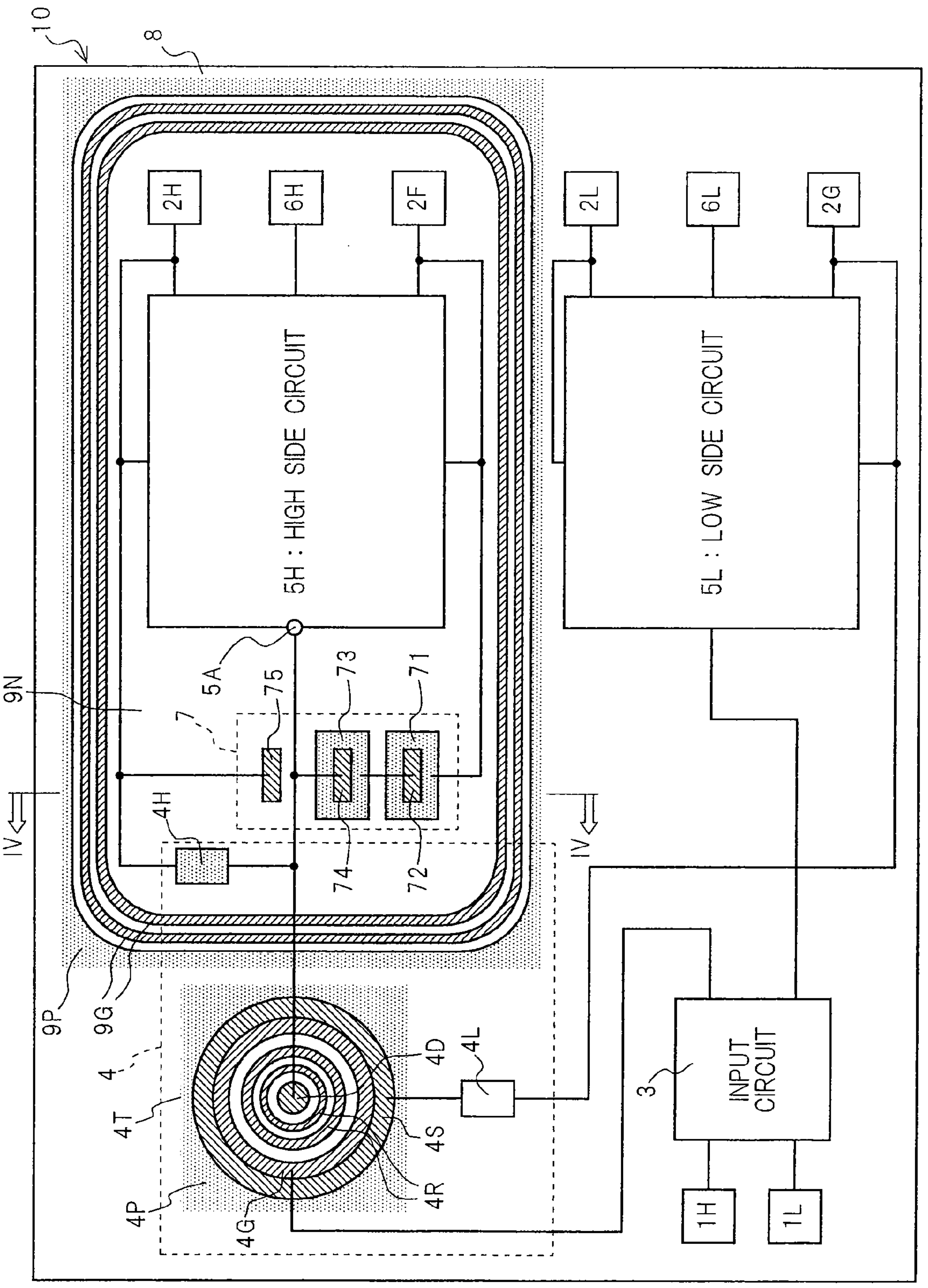
FIG. 3 is a schematic diagram that shows the outline of the mask layout of a control circuit 10 according to Embodiment 1 of the invention, when being unified into an integrated circuit.
Figure 4:
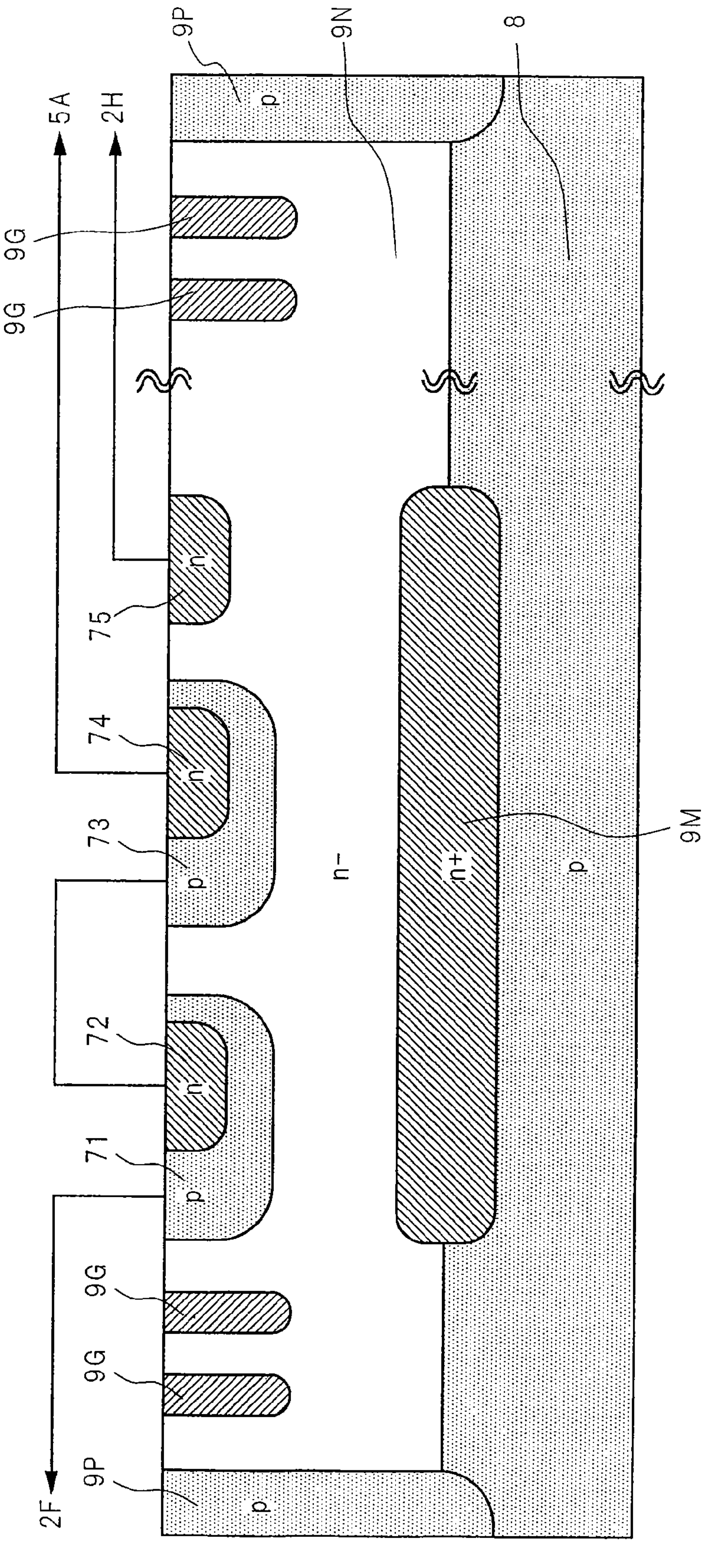
FIG. 4 is a cross-sectional view taken on a line IV-IV shown in FIG. 3, which includes the region of a bipolar transistor circuit 7 according to Embodiment 1 of the invention.

The control circuit 10 is, preferably, unified into a single integrated circuit on a common p type substrate 8. FIG. 3 is the schematic diagram that shows the outline of the mask layout of the unified control circuit 10, and FIG. 4 is the cross-sectional view that includes the region of the bipolar transistor circuit 7. See the line IV-IV indicated in FIG. 3. In FIGS. 3 and 4, the same components as the components shown in FIG. 2 are marked with the same reference symbols as the reference symbols shown in FIG. 2.

The level shift transistor 4T is electrically separated from the other circuit elements by the first p type separation region 4P, since the drain potential (the level shift voltage) can rise to a high potential equal to or above the potential of the high potential power supply terminal 21 (200 V). The first p type separation region 4P surrounds a nearly circular region on the p type substrate 8. At the outermost part of the circular region, an annular n type diffusion region 4S is formed as a source region of the level shift transistor 4T. At the central part of the above-described circular region, a disk-shaped n type diffusion region 4D is formed as a drain region of the level shift transistor 4T. Inside the source region 4S, an annular poly silicone gate 4G is formed, and further inside the gate 4G, more than one (for example, two) annular guard rings 4R are installed. The guard rings 4R reduce electric field strengths between the poly silicone gate 4G and the drain region 4D, and maintains a high withstand voltage between the poly silicone gate 4G and the drain region 4D.

The high side power supply terminal 2H, the floating power supply terminal 2F, the pull-up resistance element 4H, the high side circuit 5H, the high side output terminal 6H, and the bipolar transistor circuit 7 are integrated into a single block, which is hereafter referred to as a floating block. The floating block is surrounded by a second p type separation region 9P, and electrically separated from the other circuit elements, since the reference potential of the floating block is the floating voltage, which can rise to the potential of the high potential power supply terminal 21 (200 V). Immediately inside the second p type separation region 9P, more than one (for example, two) guard rings 9G are provided. The guard rings 9G reduce electric field strengths in a predetermined region between the floating block and the second p type separation region 9P (for example, the range of 20 μm-40 μm inside the second p type separation region 9P), and maintains a high withstand voltage between the floating block and the outside. Circuit elements in the floating block are provided further inside the guard rings 9G.

A field plate may be installed, in place of or in addition to the guard rings 4G and 9G, on insulation films that cover the surface of the region where electric field strengths are to be reduced. The field plate is preferably composed of an aluminum or poly silicone electrode.

In the floating block, withstand voltages may be low since the difference between the potential of the high side power supply terminal 2H and the floating voltage is maintained around the voltage of the constant-voltage source 31 (15 V). Accordingly, in the floating block, circuit elements are not required to be electrically separated from each other. Furthermore, the design rule applied in the floating block may be the minimum unit of the manufacture process (the order of submicrons). Thus, the floating block is easy to miniaturize.

The two input terminals 1H and 1L, the low side power supply terminal 2L, the low potential power supply terminal 2G, the input circuit 3, the source resistance element 4L, the low side circuit 5L, and the low side output terminal 6L may require withstand voltages to be maintained around the potential difference between the low side power supply terminal 2L and the low potential power supply terminal 2G, or the voltage of the constant-voltage source 31 (15 V). Accordingly, the circuit elements do not require to be electrically separated from each other. Furthermore, the design rule may be the minimum unit of the manufacture process (the order of submicrons).

In the floating block, in particular, in the region of the bipolar transistor circuit 7, an n+ type buried layer 9M is formed on the p type substrate 8. See FIG. 4. On the buried layer, an n-type epitaxial layer 9N is formed. The n-type epitaxial layer 9N is surrounded by a second p type separation region 9P. The depth of the second p type separation region 9P reaches the p type substrate 8 from the surface of the n-type epitaxial layer 9N. Thereby, the n-type epitaxial layer 9N is separated from the outside by the second p type separation region 9P. Around the surfaces immediately inside the second p type separation region 9P, two guard rings 9G are provided along the second p type separation region 9G. Above the n+ type buried layer 9M, two p type diffusion regions 71 and 73 are formed within the n-type epitaxial layer 9N. Within the p type diffusion regions 71 and 73, n type diffusion regions 72 and 74 are formed, respectively. The combination of the first p type diffusion region 71, the first n type diffusion region 72, and the n-type epitaxial layer 9N is equivalent to the first bipolar transistor 7A, and the combination of the second p type diffusion region 73, the second n type diffusion region 74, and the n-type epitaxial layer 9N is equivalent to the second bipolar transistor 7B. See FIG. 2. The first p type diffusion region 71 is connected through the conducting path over the region to the floating power supply terminal 2F, and thus functions as the base of the bipolar transistor circuit 7. The first n type diffusion region 72 is connected through the conducting path over the region to the second p type diffusion region 73. The second n type diffusion region 74 is connected through the conducting path over the region to the input terminal 5A of the high side circuit 5H, and thus functions as the emitter of the bipolar transistor circuit 7. In the close vicinity of the second p type diffusion region 73, an n type diffusion region 75 other than the first and second n type diffusion regions 72 and 74 is formed. This n type diffusion region 75 is connected through the conducting path over the region to the high side power supply terminal 2H. Thereby, the whole of the n-type epitaxial layer 9N that covers the n+ type buried layer 9M functions as the collector of the bipolar transistor circuit 7. Hereafter, the n type diffusion region 75 is referred to as a collector contact section. In this structure, the bipolar transistor circuit 7 is equivalent to the Darlington connection of the two bipolar transistors 7A and 7B. See FIG. 2. Alternatively, the bipolar transistor circuit 7 may be formed into an equivalent to the Darlington connections of three or more bipolar transistors. In addition, the bipolar transistor circuit 7 may be composed of a single bipolar transistor; for example, it may be formed as the second n type diffusion region 74 within the first p type diffusion region 71.

In the bipolar transistor circuit 7, the base current is maintained much smaller than the collector current, as described above. Accordingly, the first p and n type diffusion regions 71 and 72 may be much smaller than the other diffusion regions. Thus, the bipolar transistor circuit 7 is easy to miniaturize with its high reliability for the overvoltage protection maintained.

The distance between the second p type diffusion region 73 and the collector contact section 75 is set, preferably, at the minimum for ensuring a required withstand voltage. In that case, the potential difference between the input terminal 5A of the high side circuit 5H and the high side power supply terminal 2H is maintained low enough, since the ON resistance between the second n type diffusion region 74 and the collector contact section 75 is low enough. Accordingly, the overvoltage protection by the bipolar transistor circuit 7 has further higher reliability.

Other than the structure shown in FIGS. 3 and 4, the collector contact section 75 may surround the whole of the first and second p type diffusion regions 71 and 73. Thereby, the current leakage from the first and second p type diffusion regions 71 and 73 to the outside is prevented.

Embodiment 2

Figure 5:
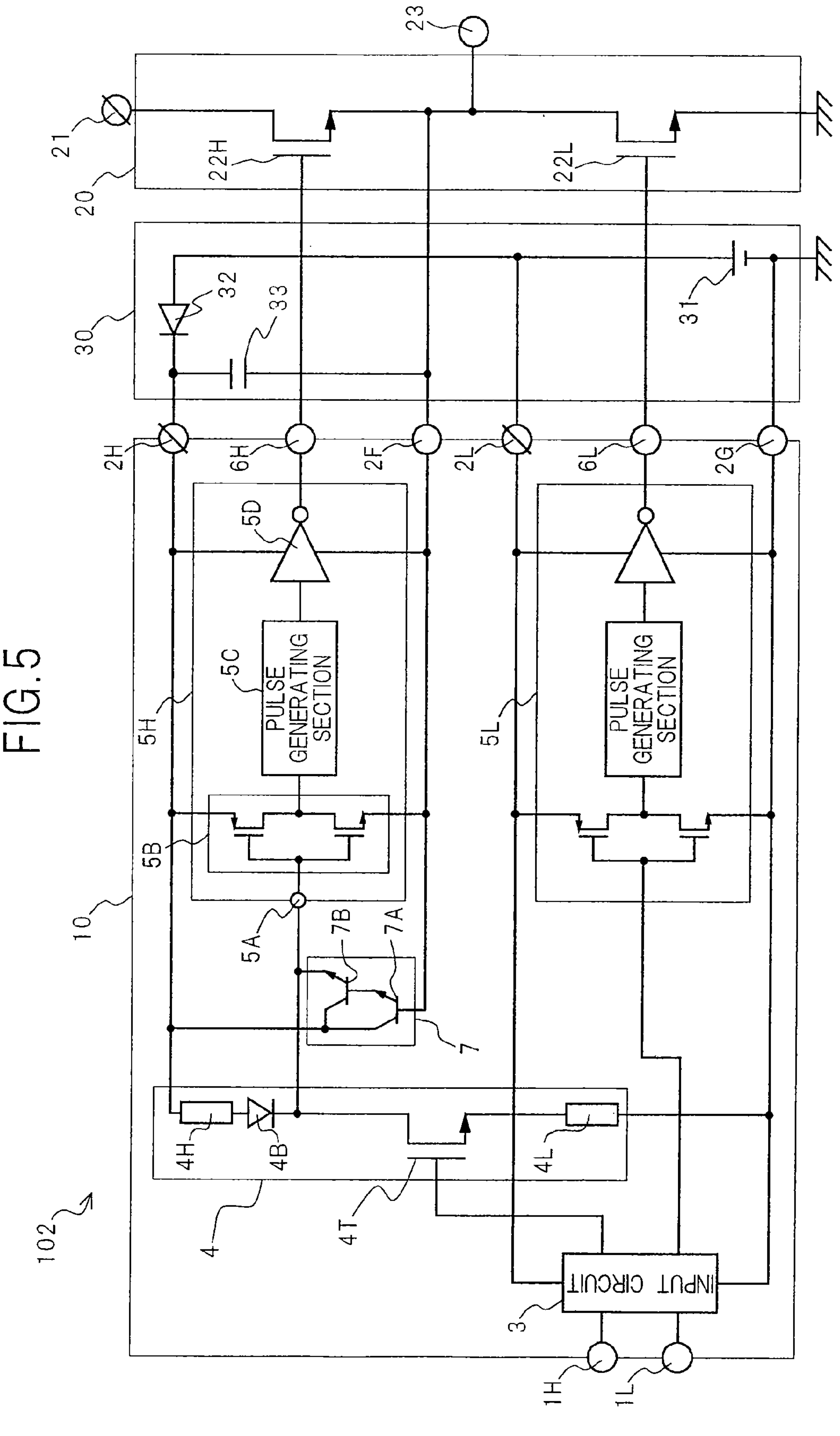
FIG. 5 is an equivalent circuit diagram that shows a sustain driver 102 according to Embodiment 2 of the invention.

A control circuit 10 of the sustain driver according to Embodiment 2 of the invention (cf. FIG. 5) comprises circuitry similar to that of the control circuit 10 according to Embodiment 1 of the invention (cf. FIG. 2). However, in the control circuit 10 according to Embodiment 2 of the invention, the level shift circuit 4 further includes a reverse current blocking diode 4B, in contrast to the control circuit 10 according to Embodiment 1 of the invention. In FIG. 5, the components similar to the components shown in FIG. 2 are marked with the same reference symbols as the reference symbols shown in FIG. 2. Furthermore, as for the details of those similar components, an explanation about Embodiment 1 is cited.

The reverse current blocking diode 4B is, preferably, inserted between the pull-up resistance element 4H and the drain of the level shift transistor 4T. The anode of the reverse current blocking diode 4B is connected to the pull-up resistance element 4H, while the cathode is connected to both the drain of the level shift transistor 4T and the input terminal 5A of the high side circuit 5H. Alternatively, the reverse current blocking diode 4B may be inserted between the pull-up resistance element 4H and the high side power supply terminal 2H. In that case, the cathode of the reverse current blocking diode 4B is connected to the pull-up resistance element 4H, while the anode is connected to the high side power supply terminal 2H. Under any of the above-described connections, the reverse current blocking diode 4B cuts off the current that flows in the direction from the drain of the level shift transistor 4T to the high side power supply terminal 2H.

For PDPs, the improvement in high image quality is desired. The improvement in high image quality requires further finer gradation of the PDP. More specifically, the brightness of the discharge cell, that is, the light emission time (in particular, the sustain period) must be adjusted more precisely. For the precise adjustment of the sustain period, it is desirable that the period of the sustaining voltage pulse is as short as possible. Therefore, for the sustain driver, it is desirable that the switching frequency and rate of the output transistors 22H and 22L are as high as possible.

In the control circuit 10, the floating voltage changes within the range from the ground potential to the potential of the high potential power supply terminal 21 (for example, 0-200 V), in synchronism with the turning on and off of the output transistors 22H and 22L. Furthermore, the potential of the high side power supply terminal 2H changes within the range higher than the range of the floating voltage by the voltage of the constant-voltage source 31 (for example, 15-215 V). The rise in the switching frequency and rate of the output transistors 22H and 22L speeds up the change of the floating voltage and the potential of the high side power supply terminal 2H. For example, when the switching time of the output transistors 22H and 22L is 4 microseconds, the change rate of the floating voltage and the potential of the high side power supply terminal 2H reaches 50 volts per microsecond. On the other hand, in the plasma display, the sustain driver is mounted, for example, on the rear substrate of the PDP together with the scan driver, the data driver, the panel control section, and the power supply section. See FIG. 1. Accordingly, the widths and thicknesses of the conducting paths connecting between the circuits are rather smaller than the lengths of them. As a result, at the high side power supply terminal 2H, the speed-up of the potential change increases the surge voltages due to the inductance components of the conducting paths so as to be reckon with.

The withstand voltage and current capacity of the level shift transistor 4T are very high and large than those of the other circuit elements inside the control circuit 10, respectively. Accordingly, a drain-source parasitic capacitance in the OFF state is much larger than the parasitic capacitances of the other circuit elements. Therefore, the change of the drain potential of the level shift transistor 4T (the level shift voltage) is delayed from the change of the above-described surge voltage. When the above-described surge voltage is excessive, the potential of the high side power supply terminal 2H can transiently fall far below the level shift voltage. At that time, the reverse current blocking diode 4B cuts off the current to flow from the drain of the level shift transistor 4T, that is, the input terminal 5A of the high side circuit 5H, through the pull-up resistance element 4H to the high side power supply terminal 2H. Thereby, the occurrence of the excessive voltage drop across the pull-up resistance element 4H due to the current is avoided. Thus, the high side circuit 5H is effectively protected from the transient overvoltage as well, regardless of the frequency of the sustaining voltage pulse. Accordingly, the control circuit 10 according to Embodiment 2 of the invention has further higher reliability.

Figure 6:
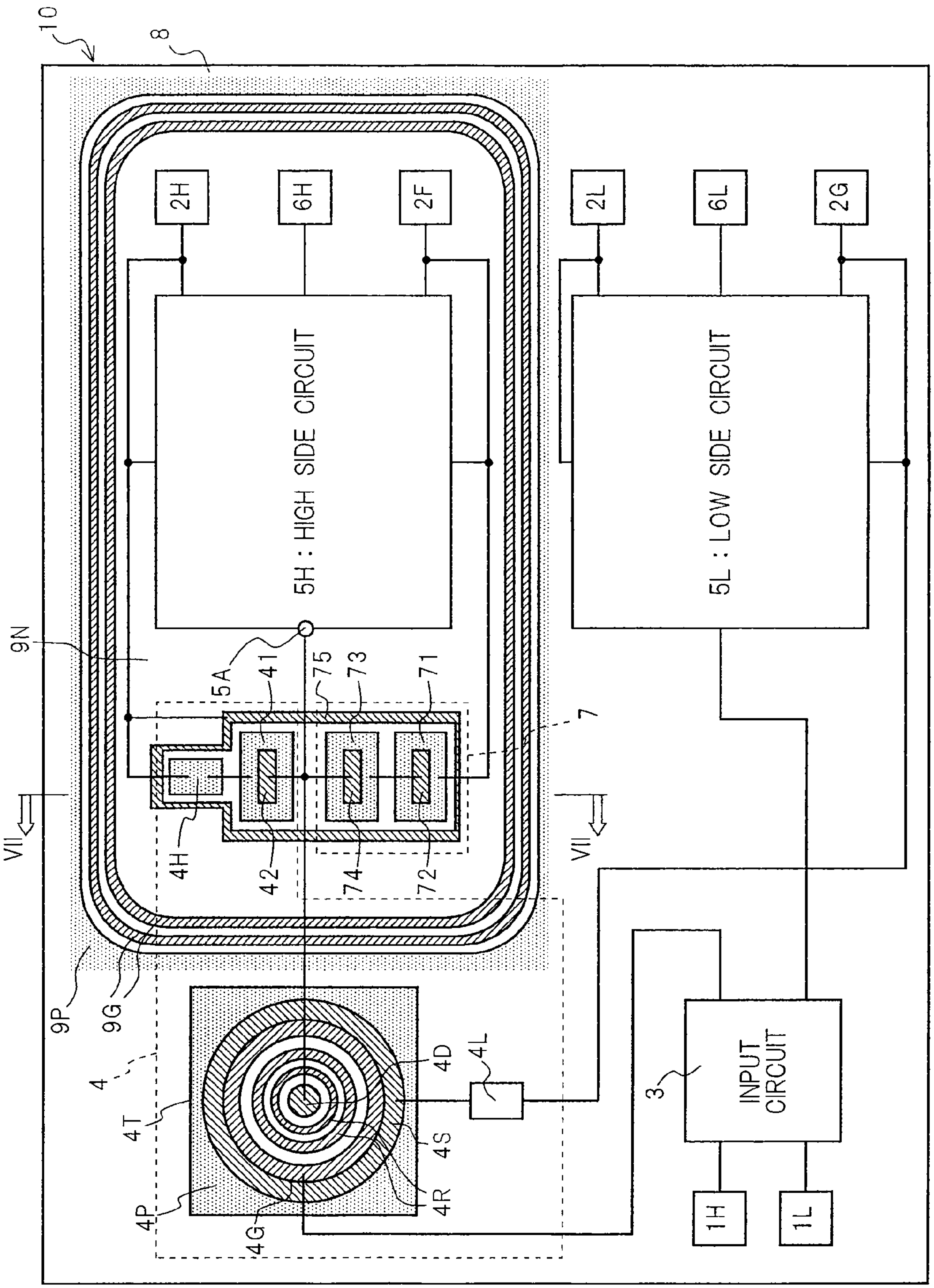
FIG. 6 is a schematic diagram that shows the outline of the mask layout of a control circuit 10 according to Embodiment 2 of the invention, when being unified into an integrated circuit.
Figure 7:
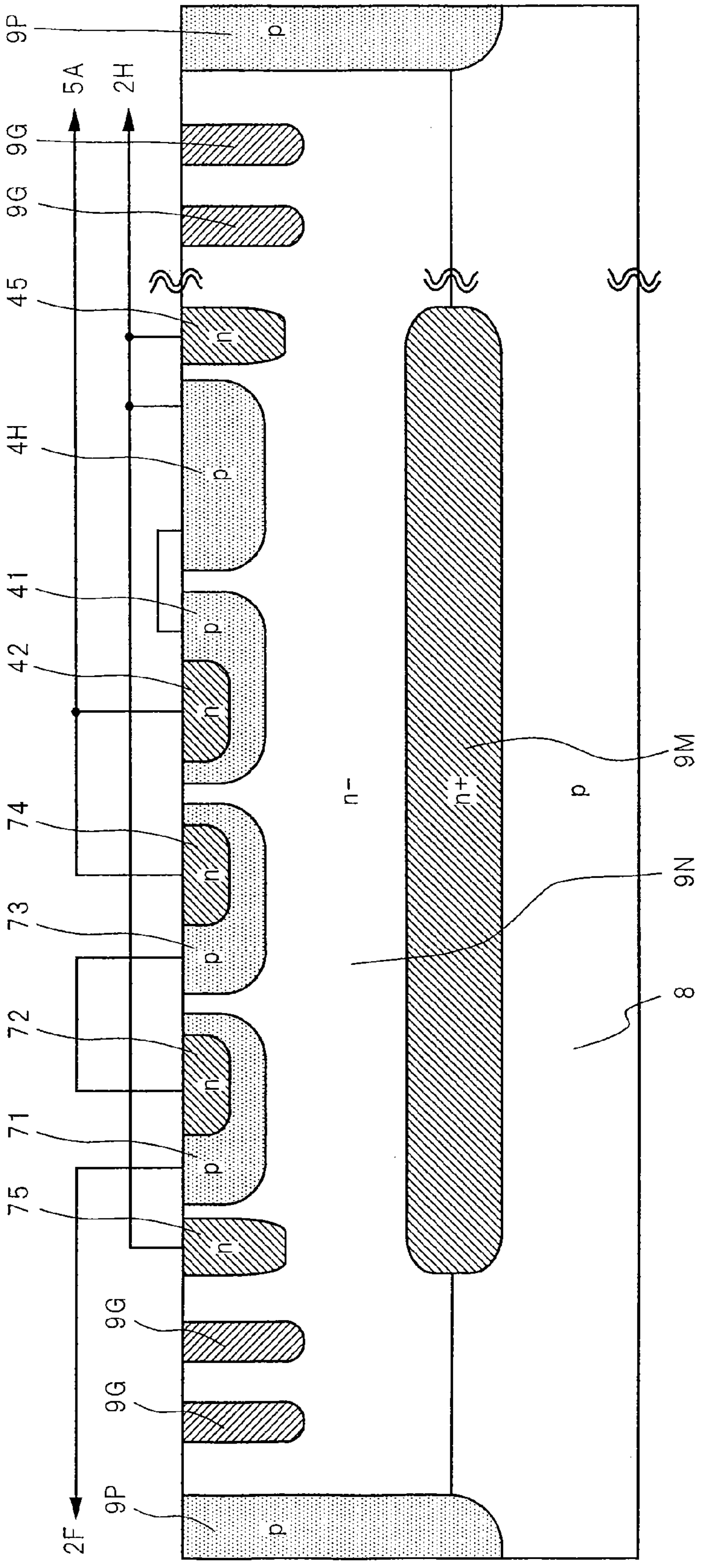
FIG. 7 is a cross-sectional view taken on a line VII-VII shown in FIG. 6, which includes the region of a bipolar transistor circuit 7 according to Embodiment 2 of the invention.
Figure 8:
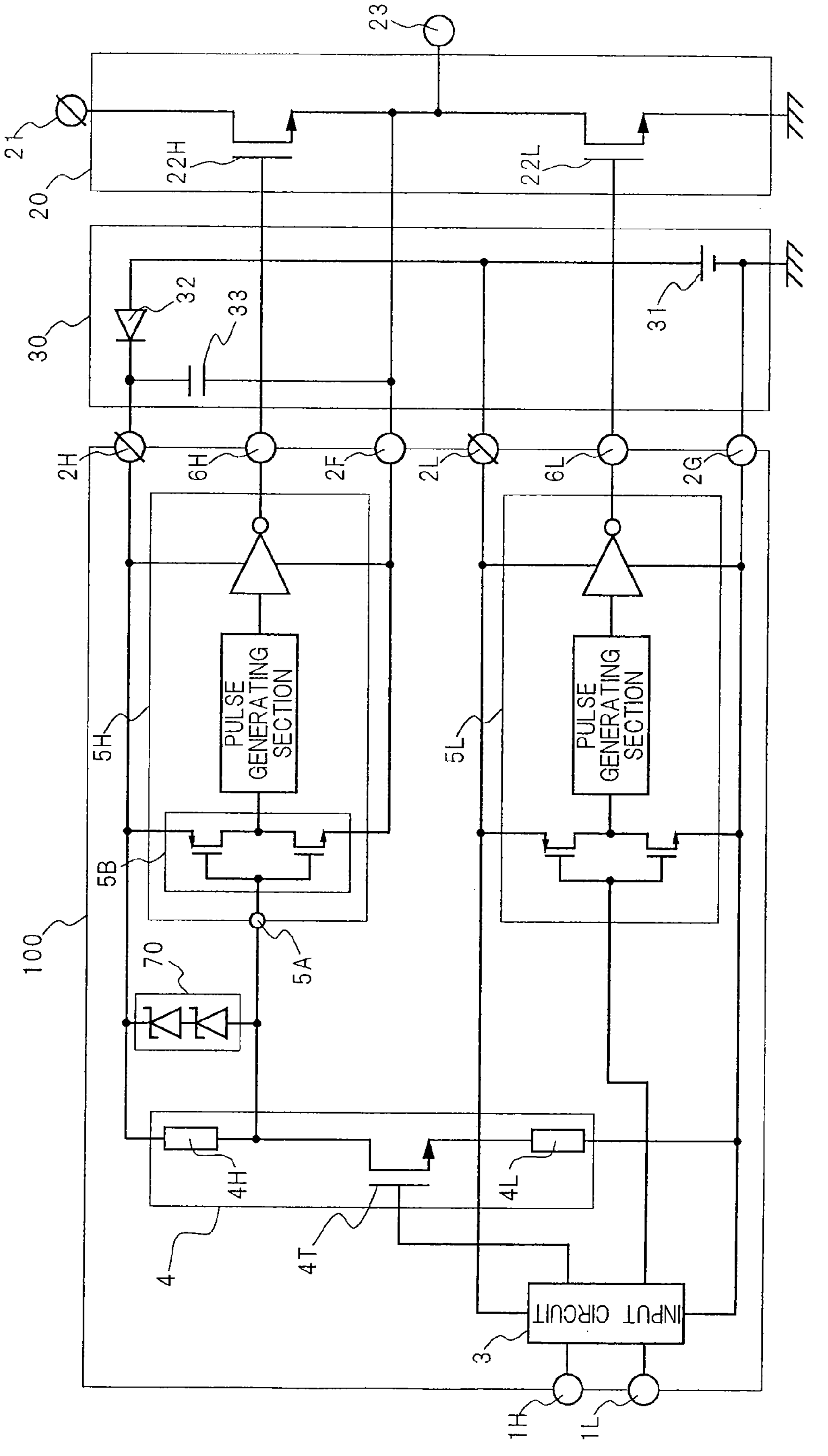
FIG.8 PRIOR ART
FIG. 8 is the equivalent circuit diagram that shows the example of the conventional sustain driver.

The control circuit 10 according to Embodiment 2 of the invention is, preferably, unified into a single integrated circuit on the common p type substrate 8 (cf. FIGS. 6 and 7), similarly to the control circuit 10 according to Embodiment 1 (cf. FIGS. 3 and 4). In FIGS. 6 and 7, the same components as the components shown in FIGS. 3 and 4 are marked with the same reference symbols as the reference symbols shown in FIGS. 3 and 4.

The reverse current blocking diode 4B is provided within the floating block, and in particular, formed within the n-type epitaxial layer 9N over the n+ type buried layer 9M, together with the pull-up resistance element 4H and the bipolar transistor circuit 7. See FIG. 7. The pull-up resistance element 4H includes a p type diffusion region, which is connected through the conducting path over the region to the high side power supply terminal 2H. The reverse current blocking diode 4B includes a third p type diffusion region 41 and a third n type diffusion region 42. The third p type diffusion region 41 is connected through the conducting path over the region to the p type diffusion region 4H of the pull-up resistance element. The third n type diffusion region 42 is formed within the third p type diffusion region 41, and connected through the conducting path over the region to the input terminal 5A of the high side circuit 5H.

A collector contact section 75A surrounds the whole of the four p type diffusion regions 71, 73, 75, and 4H in Embodiment 2 of the invention, in contrast to Embodiment 1. The collector contact section 75A is connected through the conducting path over the section to the high side power supply terminal 2H. Thereby, the whole of the n-type epitaxial layer 9N which covers the n+ type buried layer 9M functions as the collector of the Darlington connection circuit 7. The distance between the second p type diffusion region 73 and the collector contact section 75A is set, preferably, at the minimum for ensuring a required withstand voltage. In that case, the ON resistance between the second n-type diffusion region 74 and the collector contact section 75A is low enough, and thereby, the potential difference between the input terminal 5A of the high side circuit 5H and the high side power supply terminal 2H is maintained small enough. Accordingly, the overvoltage protection by the bipolar transistor circuit 7 has high reliability. Furthermore, the collector contact section 75A surrounds the first through third p type diffusion regions 71, 73, and 75, and the p type diffusion region 4H of the pull-up resistance element, and thus, prevents the current leakage from the p type diffusion regions 71, 73, 75, and 4H to the outside. When the leakage current is small enough, the collector contact section 75A may be provided in the vicinity of the second p type diffusion region 73, similarly to the collector contact section 75 according to Embodiment 1 of the invention. See FIGS. 3 and 4.

The above-described disclosure of the invention in terms of the presently preferred embodiments is not to be interpreted as intended for limiting. Various alterations and modifications will no doubt become apparent to those skilled in the art to which the invention pertains, after having read the disclosure. As a corollary to that, such alterations and modifications apparently fall within the true spirit and scope of the invention. Furthermore, it is to be understood that the appended claims be intended as covering the alterations and modifications.

The control circuit according to the invention is installed in the sustain driver of the plasma display. The control circuit uses the bipolar transistor circuit for the overvoltage protection as described above. Thus, the invention obviously has industrial applicability.

What is claimed is:

1. A control circuit, said control circuit generating high and low side output signals under control signals received from the outside and sending the output signals to an output circuit, said control circuit comprising:

a high side power supply terminal maintained at a potential equal to or above a predetermined lower limit;

a floating power supply terminal maintained at a potential equal to a constant voltage lower than the potential of said high side power supply terminal;

a low side power supply terminal maintained at a constant potential;

a low potential power supply terminal maintained at a potential equal to a constant voltage lower than the potential of said low side power supply terminal;

an input circuit generating high and low side control signals based on said control signals;

a level shift circuit including a resistance element with a first terminal connected to said high side power supply terminal, and a level shift transistor having an output section, said level shift transistor being connected between a second terminal of said resistance element and said low potential power supply terminal and changing the potential of the second terminal of said resistance element under said high side control signal;

a high side circuit including an input terminal connected to the second terminal of said resistance element and converting a potential change of said input terminal into said high side output signal, by using the potential difference between said high side and floating power supply terminals;

a low side circuit converting said low side control signal into said low side output signal, by using the potential difference between said low side and low potential power supply terminals; and a bipolar transistor circuit including a collector connected to said high side power supply terminal, an emitter connected to said output section of said level shift transistor, and a base connected to said floating power supply terminal.

2. The control circuit according to claim 1, wherein said bipolar transistor circuit includes a Darlington connection of at least two bipolar transistors.

3. The control circuit according to claim 2, wherein:

said Darlington connection includes first and second bipolar transistors, said collector is a common collector of said first and second bipolar transistors, said emitter is the emitter of said second bipolar transistor, said base is the base of said first bipolar transistor, and the emitter of said first bipolar transistor is connected to the base of said second bipolar transistor.

4. The control circuit according to claim 1, when being configured as an integrated circuit on a common substrate:

said high side circuit and said bipolar transistor circuit are surrounded by a p-type separation region; and said bipolar transistor circuit including, an n-type epitaxial layer connected to said high side power supply terminal, a first p-type diffusion region formed within said n-type epitaxial layer and connected to said floating power supply terminal, a first n-type diffusion region formed within said first p-type diffusion region, a second p-type diffusion region formed within said n-type epitaxial layer and connected to said first n-type diffusion region, and a second n-type diffusion region formed within said second p-type diffusion region and connected to said input terminal of said high side circuit.

5. The control circuit according to claim 1, wherein:

one of said high side and floating power supply terminals is connected to said output circuit; and said level shift circuit comprises a reverse current blocking diode inserted between said high side power supply terminal and said level shift transistor and cutting off a current flowing in the direction from said level shift transistor to said high side power supply terminal.

6. The control circuit according to claim 4, wherein:

one of said high side and floating power supply terminals is connected to said output circuit; and said level shift circuit comprises a reverse current blocking diode including a third p-type diffusion region formed within said n-type epitaxial layer and connected to said high side power supply terminal, and a third n-type diffusion region formed within said third p-type diffusion region and connected to said input terminal of said high side circuit.

7. A sustain driver for applying a sustaining voltage pulse to electrodes of a display panel and comprising:

a floating voltage generating circuit including first to fourth output terminals, maintaining said first output terminal at a potential equal to or above a predetermined lower limit, maintaining said second output terminal at a potential equal to a constant voltage lower than the potential of said first output terminal, maintaining said third output terminal at a constant potential, and maintaining said fourth output terminal at a potential equal to a constant voltage lower than the potential of said third output terminal;

an output circuit comprising a high potential power supply terminal connected to an external constant-voltage source and maintained at a predetermined high potential, two output transistors connected in series between said high potential power supply terminal and the fourth output terminal of said floating voltage generating circuit, and turned on and off under high and low side output signals received from the outside, and a voltage pulse output terminal connected between the node of said two output transistors and the electrodes of said display panel; and a control circuit comprising:

a high side power supply terminal connected to the first output terminal of said floating voltage generating circuit, a floating power supply terminal connected to the second output terminal of said floating voltage generating circuit, a low side power supply terminal connected to the third output terminal of said floating voltage generating circuit, a low potential power supply terminal connected to the fourth output terminal of said floating voltage generating circuit, an input circuit generating high and low side control signals based on a control signal received from the outside, a level shift circuit including a resistance element with a first terminal connected to said high side power supply terminal, and a level shift transistor having an output section, said level shift transistor being connected between a second terminal of said resistance element and said low potential power supply terminal and changing the potential of the second terminal of said resistance element under said high side control signal, a high side circuit including an input terminal connected to the second terminal of said resistance element and converting a potential change of said input terminal into said high side output signal, by using the potential difference between said high side and floating power supply terminals, a low side circuit converting said low side control signal into said low side output signal, by using the potential difference between said low side and low potential power supply terminals, and a bipolar transistor circuit including a collector connected to said high side power supply terminal, an emitter connected to said output section of said level shift transistor, and a base connected to said floating power supply terminal.

8. The sustain driver according to claim 7 wherein said floating voltage generating circuit comprises:

a constant-voltage source connected between said low side and low potential power supply terminals;

a diode with an anode connected to a positive electrode of said constant-voltage source and a cathode connected to said high side power supply terminal; and a capacitor connected between said high side and floating power supply terminals.

9. A display device comprising:

a display panel including: luminescent cells; and electrodes applying a voltage pulse received from the outside to said luminescent cells; and a sustain driver for applying said sustaining voltage pulse to the electrodes of said display panel and comprising:

a floating voltage generating circuit including first to fourth output terminals, maintaining said first output terminal at a potential equal to or above a predetermined lower limit, maintaining said second output terminal at a potential equal to a constant voltage lower than the potential of said first output terminal, maintaining said third output terminal at a constant potential, and maintaining said fourth output terminal at a potential equal to a constant voltage lower than the potential of said third output terminal;

an output circuit comprising a high potential power supply terminal connected to an external constant-voltage source and maintained at a predetermined high potential, two output transistors connected in series between said high potential power supply terminal and the fourth output terminal of said floating voltage generating circuit, and turned on and off under high and low side output signals received from the outside, and a voltage pulse output terminal connected between a node of said two output transistors and the electrodes of said display panel; and a control circuit comprising:

a high side power supply terminal connected to the first output terminal of said floating voltage generating circuit, a floating power supply terminal connected to the second output terminal of said floating voltage generating circuit, a low side power supply terminal connected to the third output terminal of said floating voltage generating circuit, a low potential power supply terminal connected to the fourth output terminal of said floating voltage generating circuit, an input circuit generating high and low side control signals based on a control signal received from the outside, a level shift circuit including a resistance element with a first terminal connected to said high side power supply terminal, and a level shift transistor having an output section, said level shift transistor being connected between a second terminal of said resistance element and said low potential power supply terminal and changing the potential of the second terminal of said resistance element under said high side control signal, a high side circuit including an input terminal connected to the second terminal of said resistance element and converting a potential change of said input terminal into said high side output signal, by using the potential difference between said high side and floating power supply terminals, a low side circuit converting said low side control signal into said low side output signal, by using the potential difference between said low side and low potential power supply terminals, and a bipolar transistor circuit including a collector connected to said high side power supply terminal, an emitter connected to said output section of said level shift transistor, and a base connected to said floating power supply terminal.

* * * * *